(12) United States Patent
Pinto et al.

(10) Patent No.: US 8,043,947 B2
(45) Date of Patent: Oct. 25, 2011

(54) METHOD TO ELIMINATE RE-CRYSTALLIZATION BORDER DEFECTS GENERATED DURING SOLID PHASE EPITAXY OF A DSB SUBSTRATE

(75) Inventors: Angelo Pinto, Allen, TX (US); Weize Xiong, Austin, TX (US); Manfred Ramin, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 108 days.

(21) Appl. No.: 11/941,187

(22) Filed: Nov. 16, 2007

(65) Prior Publication Data

US 2009/0130817 A1    May 21, 2009

(51) Int. Cl.
*H01L 21/425* (2006.01)

(52) U.S. Cl. ........ 438/530; 438/424; 438/514; 438/518; 438/522; 438/526

(58) Field of Classification Search .................... 438/12, 438/166, 424, 511, 514, 517, 518, 522, 526, 438/530, FOR. 154
See application file for complete search history.

(56) References Cited

U.S. PATENT DOCUMENTS

| 6,069,091 | A * | 5/2000 | Chang et al. .................. 438/719 |
| 6,659,846 | B2 * | 12/2003 | Misra et al. .................... 451/41 |
| 2005/0064710 | A1 * | 3/2005 | Chidambarrao et al. ..... 438/689 |
| 2005/0116290 | A1 | 6/2005 | de Souza et al. |
| 2006/0275971 | A1 * | 12/2006 | Fogel et al. ................... 438/198 |
| 2006/0276011 | A1 | 12/2006 | Fogel et al. |
| 2007/0020878 | A1 * | 1/2007 | Nam ............................. 438/424 |
| 2007/0128804 | A1 * | 6/2007 | Jin et al. ........................ 438/258 |
| 2007/0181977 | A1 * | 8/2007 | Lochtefeld et al. ........... 257/618 |

OTHER PUBLICATIONS

"Saenger et al., Amorphization/templated recrystallization method for changing the orientation of single-crystal silicon: An alternative approach to hybrid orientation substrates," Nov. 23, 2005, Applied Physics Letters, 87, 221911, 1-3.*

* cited by examiner

*Primary Examiner* — N Drew Richards
*Assistant Examiner* — Joannie A Garcia
(74) *Attorney, Agent, or Firm* — Warren L. Franz; Wade J. Brady, III; Frederick J. Telecky, Jr.

(57) ABSTRACT

A method for semiconductor processing provides a DSB semiconductor body having a first crystal orientation, a second crystal orientation, and a border region disposed between the first and second crystal orientations. The border region further has a defect associated with an interface of the first crystal orientation and second the second crystal orientation, wherein the defect generally extends a distance into the semiconductor body from a surface of the body. A sacrificial portion of the semiconductor body is removed from the surface thereof, wherein removing the sacrificial portion at least partially removes the defect. The sacrificial portion can be defined by oxidizing the surface at low temperature, wherein the oxidation at least partially consumes the defect. The sacrificial portion can also be removed by CMP. An STI feature may be further formed over the defect after removal of the sacrificial portion, therein consuming any remaining defect.

15 Claims, 3 Drawing Sheets

METHOD TO ELIMINATE RE-CRYSTALLIZATION BORDER DEFECTS GENERATED DURING SOLID PHASE EPITAXY OF A DSB SUBSTRATE

FIELD OF THE INVENTION

The present invention relates generally to semiconductor processing, and more particularly to a method for eliminating border defects associated with a re-crystallization of a direct silicon bonded substrate.

BACKGROUND OF THE INVENTION

In the semiconductor field, performance demands on complementary metal oxide semiconductor (CMOS) circuits continue to increase. Typically, CMOS circuits comprise n-type FETs (nFETs), which utilize electron carriers for their operation, and p-type FETs (pFETs), which utilize hole carriers for their operation. CMOS circuits are conventionally fabricated on semiconductor wafers (e.g., a silicon wafer) having a single crystal orientation. In particular, most common semiconductor devices have been previously built on silicon wafers having a (100) surface crystal orientation.

Recently, specialty semiconductor substrates have been utilized to improve the performance of the nFETs and pFETs. For example, the strong dependence of carrier mobility on silicon orientation has led to the use of hybrid orientation technology (HOT) or direct silicon bond (DSB) silicon substrates, wherein nFETs are formed in (100) crystal orientation silicon (e.g., the orientation in which electron mobility is higher) and pFETs are formed in (110)-oriented Si (the orientation in which hole mobility is higher.

HOT or DSB semiconductor processing conventionally utilizes amorphization/templated recrystallization (ATR) methods for fabricating hybrid orientation substrates, wherein a first semiconductor layer having a first crystalline orientation is directly bonded to a second semiconductor layer having a second crystalline orientation, wherein the second crystalline orientation differs from the first. Selected areas of the first semiconductor layer are amorphized by ion implantation, and then recrystallized into the orientation of the second semiconductor layer, wherein the second semiconductor layer is used as a crystal template for the recrystallization.

One problem encountered in conventional ATR methods concerns corner defects where the first crystalline orientation meets the second crystalline orientation at or near the surface of the substrate. Such corner defects are believed to be the result of the differing crystal orientations meeting at or near the surface of the substrate, wherein differing speeds of crystal growth and mismatches in lattice constants cause crystalline mismatches in the border region between the first crystalline orientation and the second crystalline orientation.

Attempts to ameliorate such corner or border defects in the past have been made by implementing a high-temperature defect-removal anneal process (e.g., ranging from 1000 C. to 1320 C. and higher), however, such high-temperature anneal processes may be incompatible with advanced lithographic techniques due to thermal stresses associated therewith. Other defect-removal techniques have involved the formation of shallow trench isolation (STI) regions over the defects, thus fully consuming the defects in the STI formation. However, as device sizes continue to become smaller and smaller, the lateral width of the defects may exceed the desired lateral width of the desired STI, thus requiring larger STI widths than desired.

SUMMARY OF THE INVENTION

Thus, a need exists for a method for removing border defects in DSB workpieces without necessitating additional high temperature anneal processes, wherein small STI regions are further permitted. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a method for removing defects associated with HOT and DSB technologies. In accordance with one example, a method for semiconductor processing is provided, comprising a semiconductor body having a surface, wherein the semiconductor body comprises a first region, a second region and a border region disposed therebetween. The first region has a first crystal orientation associated therewith and the second region has a second crystal orientation associated therewith, wherein the first crystal orientation differs from the second crystal orientation, and wherein the border region comprises a defect associated with an interface of the first crystal orientation and the second crystal orientation. The defect, for example, comprises a corner defect having a first lateral width at the surface of the semiconductor body, and a first depth generally extending into the semiconductor body from the surface.

In accordance with the present invention, a sacrificial portion of the semiconductor body is removed from the surface thereof, wherein the sacrificial portion extends across the surface of the semiconductor body and has a predetermined thickness extending into the semiconductor body. By removing the sacrificial portion of the semiconductor body the defect is at least partially removed. According to one example, the surface of the semiconductor body is oxidized, therein defining the sacrificial portion. Accordingly, the oxidation of the surface at least partially consumes the defect, and the now-oxidized sacrificial portion of the semiconductor body can be removed, for example, by a wet etch of the semiconductor body. In one example, the oxidation of the surface of the semiconductor body comprises a low temperature thermal oxidation of the semiconductor body at less than approximately 900 C.

According to another example, oxidizing the surface of the semiconductor body further comprises forming a step in the semiconductor body between the first region and the second region, wherein the step in the semiconductor body remains after the sacrificial portion is removed. The formation of the step, for example, is based, at least in part, on a difference in a rate of oxidation of the surface between the first region and the second region. In one particular example, one or more alignment marks may be generated on the semiconductor body based, at least in part, on the step in the semiconductor body between the first region and the second region. The one or more alignment marks may be then further used in a subsequent lithographic process.

In another aspect of the present invention, the sacrificial portion of the semiconductor body is removed by a chemical-mechanical polish (CMP) of the surface of the semiconductor body. For example, anywhere between approximately 30 nm and 60 nm of the body (the predetermined thickness of the sacrificial portion) is removed by CMP.

The defect may be either partially or completely removed by the method of the present invention. Further, a shallow trench isolation feature can be formed in the border region, wherein the shallow trench isolation feature further fully consumes the defect. In one example, after removing the sacrificial portion of the semiconductor body, the defect has a second lateral width at the surface of the semiconductor body and a second depth extending into the semiconductor body. According to the present invention, a width and depth of the shallow trench isolation feature is greater than the respective second lateral width and second depth of the defect, while maintaining the width of the shallow trench isolation feature as less than approximately 75 nm.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
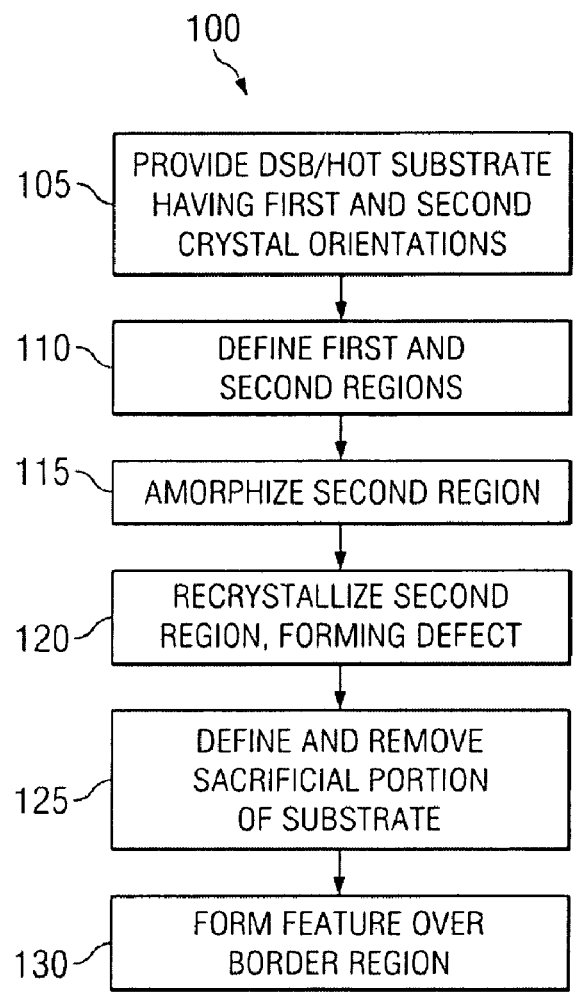
FIG. 1 illustrates a block diagram schematic of a method for processing a semiconductor workpiece in accordance with one exemplary aspect of the present invention.

The present invention is generally directed towards methods for removing border defects in DSB workpieces. In particular, the present invention provides a method for removing the defects without necessitating additional high temperature anneal processes, and wherein formation of small STI regions is further permitted over the defects. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the drawings, FIG. 1 illustrates a method 100 for removing defects according to one aspect of the present invention. FIGS. 2A-2F further illustrate examples of acts shown in FIG. 1 at various stages of processing, as will be described in greater detail infra. It should be noted that while example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In act 105 of FIG. 1, a direct silicon bond (DSB) semiconductor body (e.g., a previously-formed DSB silicon substrate or wafer) or a semiconductor body or substrate utilizing hybrid orientation technology (HOT) is provided. In act 110, one or more first regions and one or more second regions are defined in the body, wherein a first crystal orientation is desired in the one or more first regions, and a second crystal orientation is desired in the one or more second regions for future formation of various CMOS circuits, such as pFETs and nFETs. One or more border regions are further defined between the one or more first regions and one or more second regions. In act 115, the one or more second regions are amorphized, such as by ion implantation. In act 120, the one or more second regions are recrystallized, wherein the one or more second regions are crystallized into the second crystal orientation. The performance of act 120, however, defines one or more border or corner defects in the one or more border regions, wherein the one or more defects are associated with an interfacing of the first crystal orientation associated with the one or more first regions and the second crystal orientation associated with the one or more second regions.

In accordance with the present invention, a sacrificial portion or layer of the body is defined and removed in act 125, wherein the one or more defects are at least partially removed, as will be discussed in further detail infra. In one example, the at least partial removal of the one or more defects is accomplished by oxidation of a surface of the body. Alternatively, the one or more defects are at least partially removed by a chemical-mechanical polish of the surface of the body. Accordingly, in act 130, one or more features, such as one or more shallow trench isolation features, are formed in the border region. The one or more features, for example, fully consume any remaining portion of the one or more defects.

Figure 2A:
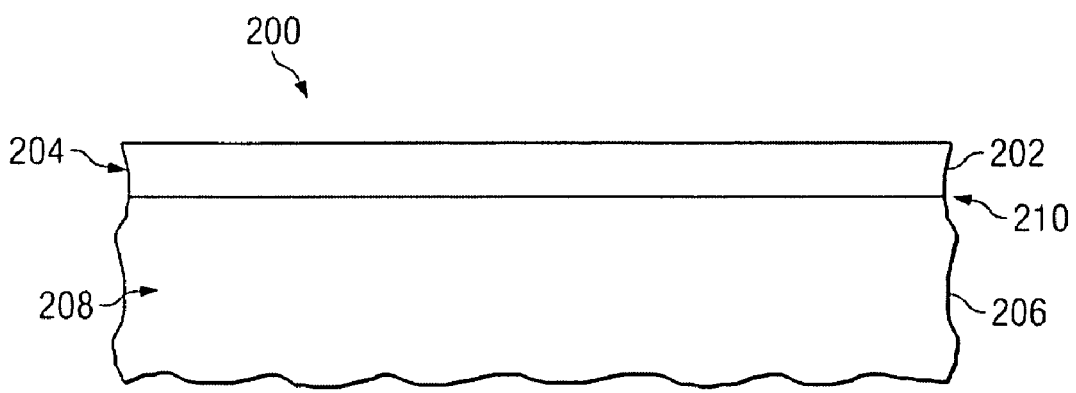
FIGS. 2A-2F illustrate cross-sectional views of a semiconductor workpiece undergoing defect removal in accordance with several aspects of the invention.

FIGS. 2A-2E illustrate one example of the method 100 of FIG. 1. FIG. 2A, for example, illustrates act 105 of FIG. 1, wherein a DSB semiconductor substrate 200 is provided in its initial form. The substrate comprises a top layer 202 having a first crystal orientation 204 associated therewith, and a handle layer 206 having a second crystal orientation 208 associated therewith, wherein the top layer 202 and the handle layer 206 are bonded at an interface 110 disposed therebetween. The first crystal orientation 104 differs from the second crystal orientation 208 of the substrate 200. For example, the first crystal orientation 204 is one of a (110) and (100) orientation, while the second crystal orientation 208 is the other of the (110) and (100) orientation. Alternatively, the first crystal orientation 204 and the second crystal orientation 208 of the respective top layer 202 and handle layer 206 may be selected from any of the (100), (110), (111), and other major and minor Miller indices, so long as the orientations differ from one another.

Figure 2B:
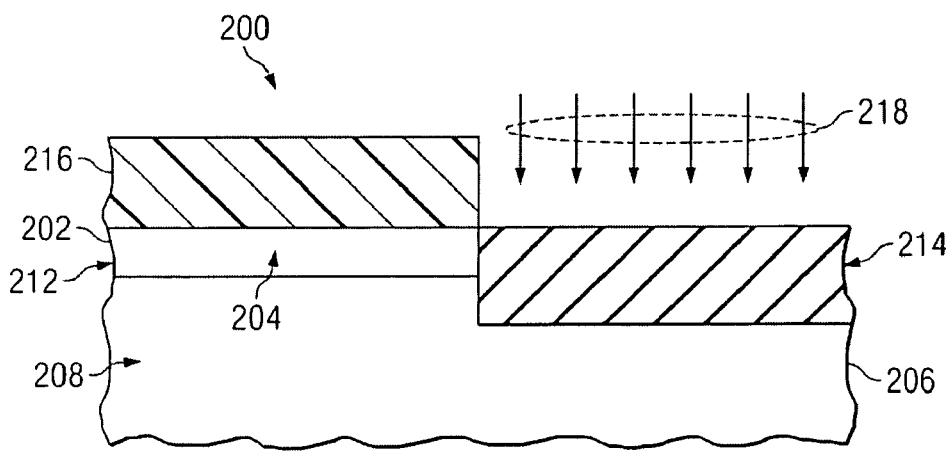

According to the invention, act 110 of FIG. 1 is illustrated in FIG. 2B, wherein a first region 212 and a second region 214 are defined in the substrate 200. According to one example, the first region 212 and second region 214 are generally defined by masking the first region with a photoresist layer 216. Act 115 of FIG. 1 is further illustrated in FIG. 2B, wherein the second region 214 is subjected to an ion implantation 218, therein amorphizing the second region. The ion implantation 218, for example, comprises implanting silicon ions into the second region 214, wherein the ion implantation has an energy of between approximately 120 KeV and 150 KeV and a dosage of between approximately $2.5 \times 10^{15}$ to $5.0 \times 10^{15}$ ions/cm$^2$. Alternatively, the second region 214 may be amorphized by implanting germanium, argon, or other ions, and any amorphization is contemplated as falling within the scope of the present invention.

Figure 2C:
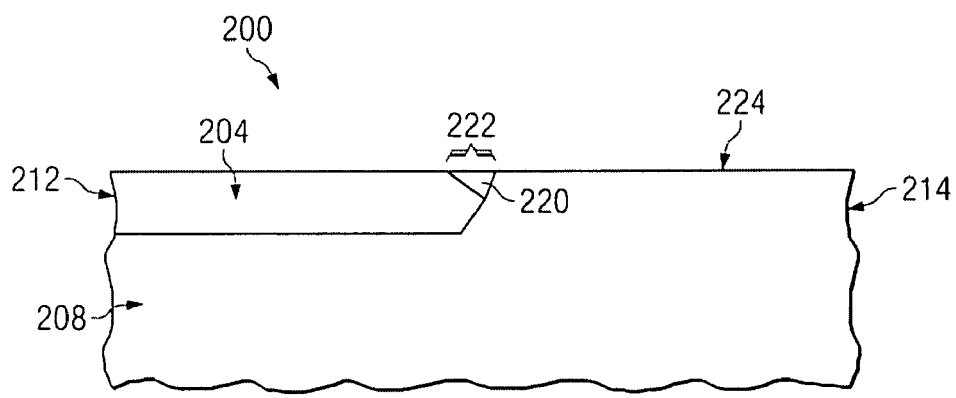

FIG. 2C illustrates the result of performing act 120 of FIG. 1, wherein the second region 214 is recrystallized, wherein the amorphized second region is recrystallized using the second crystal orientation 208 of the handle layer 206 of FIG. 2A as a template. Thus, the second region 214 of FIG. 2C recrystallizes into the second crystal orientation 208. For example, the recrystallization of the second region 214 comprises a solid phase epitaxy (SPE) process in an ambient nitrogen environment at a temperature ranging from approximately 550 C. to approximately 700 C. Subsequent to the recrystallization of the second region 214, for example, a high temperature anneal (e.g., greater than 1050 C.) of the substrate 200 may be performed in order to minimize residual damage (e.g., EOR damage).

In the process of recrystallization of act 120 of FIG. 1, however, a defect 220 of FIG. 2C is generated at a border region 222 between the first region 212 and second region 214. The defect 220, for example, is associated with the difference between the first crystal orientation 204 and second crystal orientation 208 meeting at or near a surface 224 of the substrate 200, wherein differing speeds of crystal growth and mismatches in lattice constants cause crystalline mismatches in the border region 222.

Figure 2D:
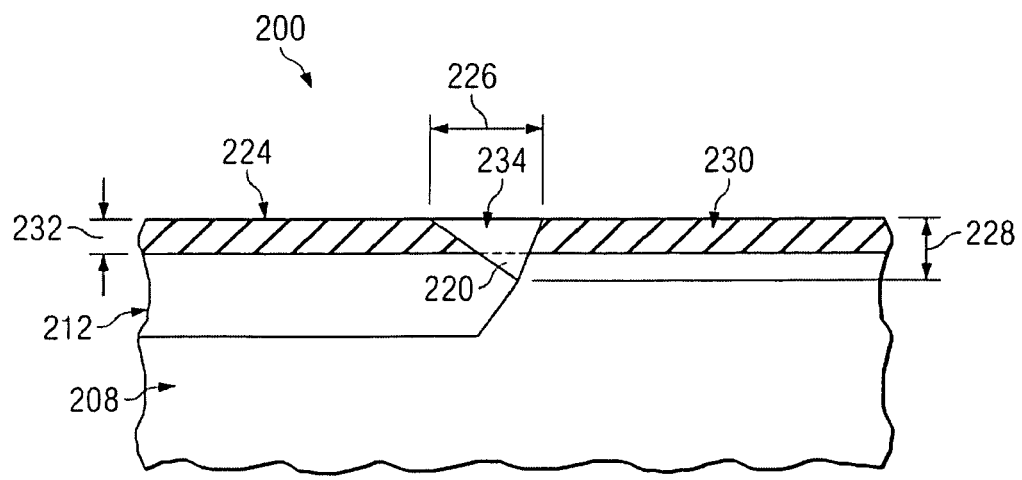

In accordance with the present invention, FIG. 2D illustrates the substrate 200 of FIG. 2C in greater detail, wherein, in the present example, the defect 220 has a first lateral width 226 at the surface 224 of the semiconductor substrate 200 and a first depth 228 generally extending into the semiconductor substrate. A sacrificial portion 230 of the semiconductor substrate 200 is further defined in FIG. 2D, wherein the sacrificial portion extends across the surface 224 of the semiconductor substrate 200 and has a predetermined thickness 232 extending into the semiconductor substrate from the surface thereof. The predetermined thickness 232 in the present example encompasses at least a portion 234 of the defect 220. While the predetermined thickness 232 illustrated in FIG. 2D is less than the first depth 228 of the defect 220, it should be noted that the predetermined thickness can alternatively be at least the first depth of the defect, thus encompassing all of the defect.

Figure 2E:
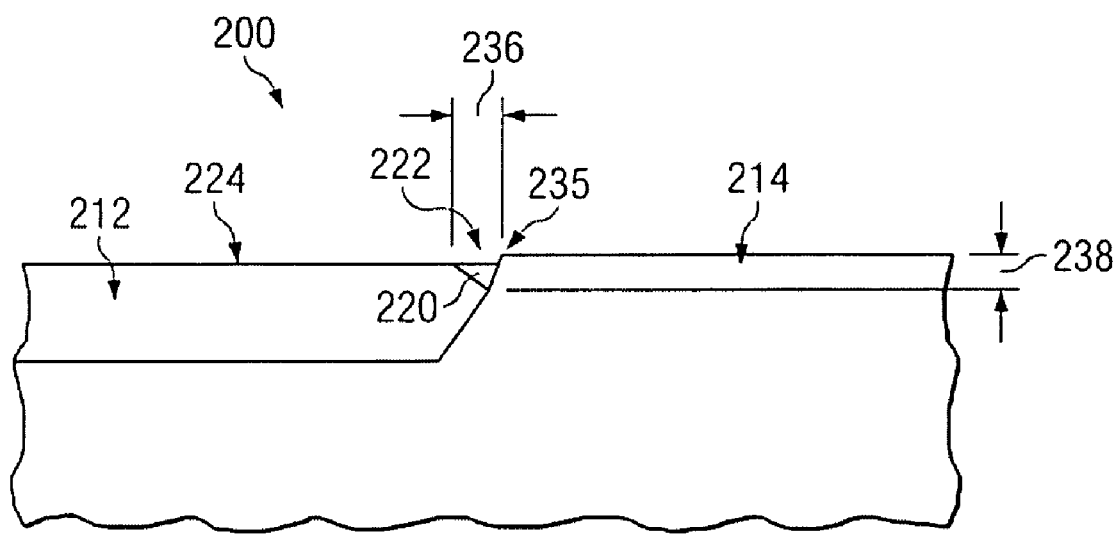

FIG. 2E illustrates the result of performing act 125 of FIG. 1, wherein the sacrificial portion 230 has been removed, therein at least partially removing the defect 220. For example, the surface 224 of the semiconductor substrate 200 of FIG. 2D is oxidized to the predetermined thickness 232 (e.g., 70 nm to 80 nm) via a low temperature thermal oxidation of the semiconductor substrate at less than approximately 900 C. Such a low temperature oxidation, for example, at least partially consumes the defect 220, while advantageously maintaining the thermal budget of the processing. The oxidized sacrificial portion 230 can be further removed via a wet etch of the substrate 200, thus at least partially removing the defect 220. Alternatively, the sacrificial portion 230 of the semiconductor substrate 200 can be removed using a chemical-mechanical polish of the surface 224 of the semiconductor substrate, therein removing the predetermined thickness of the sacrificial portion. For example, a CMP of the surface 224 down to a predetermined thickness ranging between approximately 30 nm and 60 nm would produce an acceptable result.

On the other hand, the result of oxidizing and removing the predetermined thickness 232 of the semiconductor substrate 200, for example, further advantageously comprises forming a step 235 in the semiconductor substrate 200 between the first region 212 and the second region 214 (where the defect 220 is partially removed), wherein the formation of the step is based, at least in part, on a difference in a rate of oxidation of the surface 224 between the first region and the second region. Accordingly, the step 235 in the semiconductor substrate 220 remains after the sacrificial portion is removed with the wet etch. The step 235 can be further utilized, for example, in defining one or more alignment marks on the semiconductor substrate 200, wherein the alignment marks can be further utilized in subsequent processing, such as in subsequent lithographic processing.

Figure 2F:
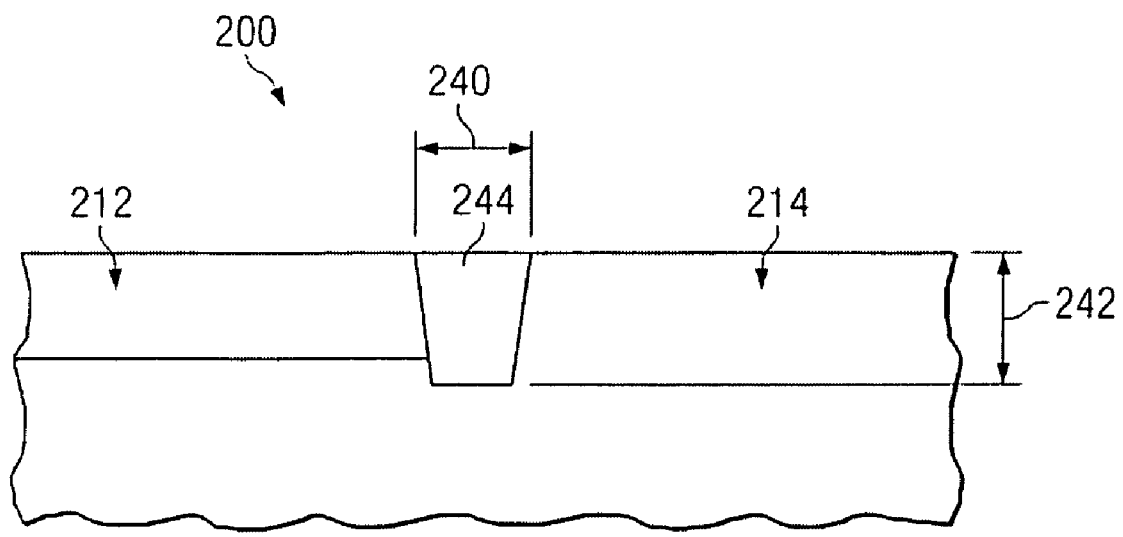

Act 130 of FIG. 1 describes forming a feature, such as an STI feature, over the border region 222, therein fully consuming any remaining portion of the defect 220. For example, after removing the sacrificial portion 230 of the semiconductor substrate 200 of FIG. 2D, the defect 220 illustrated in FIG. 2E has a second lateral width 236 at the surface 224 of the semiconductor substrate and a second depth 238 extending into the semiconductor substrate. Preferably, as illustrated in FIG. 2F, a width 240 and a depth 242 of feature 244 (e.g., an STI feature) are greater than the respective second lateral width 236 and second depth 238 of the defect 220 of FIG. 2E, thus fully consuming the defect 220. Accordingly, the present invention advantageously allows the formation of a feature 244 having a width that is less than approximately 75 nm, while eliminating corner or border defects in an efficient manner.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method for fabricating an integrated circuit, comprising:

providing a hybrid orientation substrate having a first semiconductor layer with a first crystalline orientation directly bonded to a second semiconductor layer with a second crystalline orientation different from the first crystalline orientation;

amorphizing a selected area of the first semiconductor layer by ion implantation, leaving a remaining area of the first semiconductor layer unamorphized;

recrystallizing the amorphized selected area into the second crystalline orientation using the second semiconductor layer as a crystal template for the recrystallization;

growing a sacrificial oxide layer over the first semiconductor layer by thermally oxidizing the first semiconductor layer, including over a border region at a surface of the first semiconductor layer between the recrystallized selected area and the unamorphized remaining area, whereby the thermal oxidation can encompass at least a portion of at least one of any border region defect associated with the crystal orientation differences of the recrystallized selected area and the unamorphized remaining area;

removing the sacrificial oxide layer, whereby any encompassed portion of the at least one of any border region defect will be simultaneously removed, thereby reducing a lateral width of the at least one of any border region defect; and following removal of the sacrificial oxide layer, forming a shallow trench isolation region in the border region, whereby formation of the shallow trench isolation region can remove a remaining portion of the at least one of any border region defect with reduced lateral width.

2. The method of claim 1, wherein the sacrificial oxide layer is grown by thermally oxidizing the first semiconductor layer at a temperature of less than about 900° C.

3. The method of claim 1, wherein the first semiconductor layer and the second semiconductor layer are silicon layers; and the sacrificial oxide layer is a silicon oxide layer.

4. The method of claim 1, wherein the first crystalline orientation is one of a (100) or (110) crystalline orientation, and the second crystalline orientation is the other of the (100) or (110) crystalline orientation.

5. The method of claim 1, wherein the sacrificial layer is removed at least in part by chemical-mechanical polishing.

6. The method of claim 1, wherein the sacrificial layer is removed at least in part by wet etching; and the thermal oxidation creates a surface step in the first semiconductor layer at the border region due to differences in oxidation rates of the first semiconductor layer in the recrystallized selected area and in the unamorphized remaining area; whereby the surface step can be used as an alignment mark for further processing.

7. The method of claim 1, wherein recrystallizing the amorphized selected area comprises conducting a solid phase epitaxy process in an ambient nitrogen environment at a temperature of approximately 550° C. to approximately 700° C.

8. A method for fabricating an integrated circuit, comprising:
providing a hybrid orientation substrate having a first silicon layer with one of a (100) or (110) crystalline orientation directly bonded to a second silicon layer with the other of the (100) or (110) crystalline orientation;
amorphizing a selected area of the first silicon layer by ion implantation, leaving a remaining area of the first silicon layer unamorphized;
recrystallizing the amorphized selected area into the other of the (100) or (110) crystalline orientation using the second silicon layer as a crystal template for the recrystallization;
growing a silicon oxide layer over the first silicon layer, including over a border region at a surface of the first silicon layer between the recrystallized selected area and the unamorphized remaining area, by thermally oxidizing the first silicon layer at a temperature of less than about 900° C., whereby the thermal oxidation can encompass at least a portion of at least one of any border region defect associated with the crystal orientation differences of the recrystallized selected area and the unamorphized remaining area;
removing the silicon oxide layer, whereby any encompassed portion of the at least one of any border region defect will be simultaneously removed, thereby reducing a lateral width of the at least one of any border region defect; and
following removal of the silicon oxide layer, forming a shallow trench isolation region in the border region, whereby formation of the shallow trench isolation region can remove a remaining portion of the at least one of any border region defect with reduced lateral width.

9. The method of claim 8, wherein the silicon oxide layer is removed at least in part by a wet etch.

10. The method of claim 9, wherein the thermal oxidation creates a surface step in the first silicon layer at the border region due to differences in oxidation rates between the silicon in the recrystallized selected area and the silicon in the unamorphized remaining area; whereby the surface step can be used as an alignment mark for further processing.

11. The method of claim 10, wherein the solid phase epitaxy process is conducted in an ambient nitrogen environment at a temperature of approximately 550° C. to approximately 700° C.

12. A method for fabricating an integrated circuit, comprising:
providing a hybrid orientation substrate having a semiconductor top layer with a first crystalline orientation directly bonded to a semiconductor handle layer with a second crystalline orientation different from the first crystalline orientation;
amorphizing a selected area of the top layer, leaving a remaining area of the top layer unamorphized;
recrystallizing the amorphized selected area into the second crystalline orientation using the handle layer as a crystal template for the recrystallization, the recrystallization generating a border defect in a border region at a surface of the top layer between the recrystallized amorphized selected region and the unamorphized remaining region, the border defect having a first lateral width and a depth;
growing a sacrificial oxide layer over the top layer by thermally oxidizing the top layer, including over the border region, whereby the sacrificial oxide layer encompasses a portion including the first lateral width and at least part of the depth of the border defect;
removing the sacrificial oxide layer, whereby the encompassed portion of the border defect is simultaneously removed, thereby reducing the border defect to a lateral width less than the first lateral width; and
following removal of the sacrificial oxide layer, forming a shallow trench isolation region in the top layer including in the border region, the shallow trench isolation having a lateral width less than the first lateral width and the shallow trench isolation region encompassing at least a portion of any remaining part of the border defect.

13. The method of claim 12, wherein the shallow trench isolation region encompasses all of any remaining part of the border defect.

14. The method of claim 12, wherein the sacrificial oxide layer encompasses a portion including a part of the depth of the border defect; and the shallow trench isolation region encompasses all of the reduced width and all of a remainder of the depth of the border defect.

15. The method of claim 12, wherein the first crystalline orientation is one of a (100) or (110) crystalline orientation, and the second crystalline orientation is the other of the (100) or (110) crystalline orientation.

* * * * *